(12) United States Patent
Nakazato

(10) Patent No.: US 6,574,143 B2
(45) Date of Patent: Jun. 3, 2003

(54) MEMORY DEVICE USING HOT CHARGE CARRIER CONVERTERS

(75) Inventor: Kazuo Nakazato, Cambridge (GB)

(73) Assignee: Hitachi Europe, Ltd., Maidenhead (GB)

( * ) Notice: Subject to any disclaimer, the term of this patent is extended or adjusted under 35 U.S.C. 154(b) by 0 days.

(21) Appl. No.: 09/732,012

(22) Filed: Dec. 8, 2000

(65) Prior Publication Data

US 2001/0013621 A1 Aug. 16, 2001

(30) Foreign Application Priority Data

Dec. 9, 1999 (EP) .............................. 99309891

(51) Int. Cl.[7] .............................. G11C 16/04
(52) U.S. Cl. .................... 365/185.18; 365/185.28; 365/185.29; 257/315
(58) Field of Search ................. 365/185.18, 185.28, 365/185.29, 185.01; 257/315; 438/257

(56) References Cited

U.S. PATENT DOCUMENTS

| | | | | |
|---|---|---|---|---|
| 4,119,995 A | * | 10/1978 | Simko | 257/317 |
| 5,763,913 A | * | 6/1998 | Jeong | 257/316 |
| 6,011,725 A | * | 1/2000 | Eitan | 365/185.33 |
| 6,212,100 B1 | * | 4/2001 | Choi | 365/185.14 |

FOREIGN PATENT DOCUMENTS

| | | |
|---|---|---|
| DE | 196 49 285 A1 | 10/1997 |
| EP | 0 831 524 A1 | 3/1998 |
| EP | 0 935 291 A | 8/1999 |

* cited by examiner

Primary Examiner—Hoai Ho
(74) Attorney, Agent, or Firm—Kenyon & Kenyon

(57) ABSTRACT

A flash memory cell is based on a floating gate transistor design in which a floating gate is separated from a channel by a tunnel oxide. The cell is programmed and erased by electrons tunnelling on and off the floating gate through the tunnel oxide. To retain charge stored on the floating gate, the tunnel oxide is relatively thick. As a result it takes a long time, of the order of 100 $\mu$s, to program and erase the cell. Injection of charge onto the floating gate is helped by hot-electron and channel inversion effects. However, no such effects help tunnelling of charge off the floating gate. Introduction of a silicon heterostructure hot-electron diode comprising an intrinsic silicon region promotes electron transport from the floating gate during erasing cycles and so reduces the erase voltage. Furthermore, the intrinsic silicon region provides an additional barrier to charge leakage, so permitting a thinner tunnel oxide to be used and thus read/write cycles become shorter.

42 Claims, 12 Drawing Sheets

MEMORY DEVICE USING HOT CHARGE CARRIER CONVERTERS

FIELD OF THE INVENTION

The present invention relates to memory devices and has particular but not exclusive application to flash memory devices.

BACKGROUND OF THE INVENTION

Attention is being directed to finding a high-capacity storage medium to replace the disk drive in computing applications. The storage medium should not have any moving parts, should have comparable capacity and have equivalent, if not better, access time as compared with the disk drives currently available. One possible candidate as a replacement is non-volatile memory based on flash memory.

A flash memory cell is an electrically erasable and programmable, non-volatile memory device and an overview of this field is given in "Flash Memory Cells—An Overview" by Pavan et al., pp. 1248–1271, Proceedings of the IEEE, Vol 85, No. 8 (1997).

A flash memory cell is based on a floating gate transistor design in which a floating gate is separated from a channel by a tunnel oxide. The cell is programmed and erased by electrons tunnelling on and off the floating gate through the tunnel oxide.

To retain charge stored on the floating gate, the tunnel oxide is relatively thick, As a result it takes a long time, of the order of 100μs, to program and erase the cell. Furthermore, to permit electrons to tunnel on and off the floating gate, a large bias is applied across the barrier.

During program cycles, tunnelling from the channel to the floating gate is helped by the fact that electrons are "heated" as they pass along the channel and by the fact that the effective height of the tunnel barrier is reduced by band-bending at the interface of the channel and the tunnel barrier. The net result of these processes is that electrons meet the tunnel barrier as hot electrons and the tunnel current is considerably increased.

A hot electron is an electron that is not in thermal equilibrium with the lattice and has an energy several times $k_bT$ above the Fermi energy, where $k_b$ is Boltzmann constant and T is lattice temperature in degrees Kelvin.

On the other hand, during erase cycles, electrons tunnelling from the floating gate do not benefit from these processes and electron transport through the tunnel barrier is by Fowler-Nordheim tunnelling only. Consequently, a higher bias is required to erase information. Furthermore, Fowler-Nordheim tunnel currents are lower than hot-electron tunnel currents and so erasing takes longer than programming Thus, the erasing cycle limits the speed of operation of the cell.

The present invention seeks to solve the problems of high operating bias and slow operation.

SUMMARY OF THE INVENTION

According to a first aspect of the present invention there is provided a memory device comprising a path for charge carriers, source and drain regions disposed at either end of the path, a node for storing charge carriers to produce a field which alters the conductivity of the path and first and second converters each for converting stored charge carriers into hot charge carriers so as to allow said charge carriers to leave said node and enter said source or drain regions in response to a given voltage configuration and for preventing charge carriers entering said source and drain regions in the absence of said voltage configuration.

The device may further comprise a control electrode operable to control charging and discharging of the node. The first converter may comprises a hot-charge diode, such as a hot-electron diode.

The first converter may comprise semiconductor material, such; as silicon, and may be undoped or doped with an impurity. The impurity concentration may be less than $10^{17}$ cm$^{-3}$.

The impurity may comprise an element that donates electrons, such as phosphorous or arsenic or and an element that accepts electrons, such as boron.

The device may further comprise a first tunnel barrier through which charge carrier may tunnel to reach the node and the first converter may comprise a second tunnel barrier. The first and second tunnel barriers may be unitary.

The second converter may comprise a third tunnel barrier and the first barrier, second and third tunnel barriers can be unitary.

The unitary tunnel barrier can be of a uniform thickness and may comprise silicon dioxide, silicon nitride or silicon oxynitride. The thickness of the unitary tunnel barrier may be between 2 and 10 nm.

Said charge carriers may enter the node via the first tunnel barrier and leave the node via the second or third tunnel barrier, The first tunnel barrier may be disposed between said node and said path. Charge carriers may pass onto said node in response to a different voltage configuration. The device may comprise a first runnel barrier through which charge carrier may tunnel to reach the node.

The first converter may comprises a diffusion barrier which may comprise silicon nitride and be 0.5 to 3 nm thick. The converter and the node may be unitary.

According to a second aspect of the present invention there is provided a memory device comprising a path for charge carriers, a node for storing charge carriers to produce a field which alters the conductivity of the path and a converter for converting stored charge carriers into hot charge carriers so as to allow said charge carriers to leave said node and enter said source or drain regions in response to a given voltage configuration and configured to prevent charge carriers form leaving said not in the absence of said voltage configuration.

According to a third aspect of the present invention there is provided a memory device comprising a channel for charge carriers, a node for strong charge carriers to produce a field which alters the conductivity of the channel, a tunnel barrier disposed between said node and said path for preventing charge carriers from entering or leaving said node, the improvement comprising a hot charge diode for additionally preventing charge from tunnelling from said channel to said node and said tunnel barrier being sufficiently thin to allow said node to We both charged and discharged on a sub microsecond timescale.

The tunnel barrier may be sufficiently thin to allow said node to: be both charged and discharged in approximately 100 ns.

According to a fifth aspect of the present invention there is provided a memory device comprising a channel for charge carriers, a node for storing charge carriers to produce a field which alters the conductivity of the channel, a tunnel barrier disposed between said node and said path for preventing charge carriers from entering or leaving said node, the improvement comprising a hot charge diode for additionally preventing charge from tunnelling from said channel to said node and said tunnel barrier having a thickness between 2 to 10 nm.

Said tunnel barrier may be approximately 4 nm thick and comprise silicon dioxide According to a sixth aspect of the present invention there is provided a method of operating a memory device comprising applying a gate bias to the control electrode, a drain bias to the drain region and a source bias to the source region. The applying of the gate bias may comprise setting the gate bias to 0V and setting either the drain bias or the source bias to 6V.

According to a seventh aspect of the present invention there is provided a method of fabricating a memory device comprising defining a path for charge carriers, defining source and drain regions disposed at either end of the path, providing a node for storing charge carriers to produce a field which alters the conductivity of the path and providing first and second converters each for converting stored charge carriers into hot charge carriers so as to allow said charge carriers to leave said node and enter said source or drain regions in response to a given voltage configuration and for preventing charge carriers entering said source and drain regions in the absence of said voltage configuration.

According to a eighth aspect of the present invention there is provided a method of fabricating a memory device, the method comprising providing a substrate, depositing a plurality of layers on said substrate, selectively etching at least some of said plurality of layers so as to define a pillar structure upstanding from an etched surface, depositing a further layer over said pillar structure and said etched surface, anisotopically etching said further layer so as to leave part thereof unetched on said etched surface at the foot of said pillar structure.

According to a ninth aspect of the present invention there is provided a method of fabricating hot charge diodes for a memory device, the method comprising providing a substrate, providing on said substrate a tunnel barrier layer, a first conducting layer, an insulating layer and a second conducting layer; selectively etching said first conducting layer, said insulating layer and said second conducting layer so as to define a pillar structure upstanding from said tunnel barrier barrier layer and comprising unetched first conducting material for forming a node, depositing a third conductive layer over said pillar structure and said tunnel barrier layer surface; and anisotopically etching said third conductive layer so as to leave part thereof unetched on said tunnel barrier layer adjacent to the node for providing a hot charge diode.

The method may further comprise depositing a diffusion barrier layer over said pillar structure before depositing said third conducting layer.

BRIEF DESCRIPTION OF THE DRAWINGS

Embodiments of the present invention will now be described, by way of example, with reference to the accompanying drawings in which.

Flash Memory Cell

Device Layout

Figure 1:
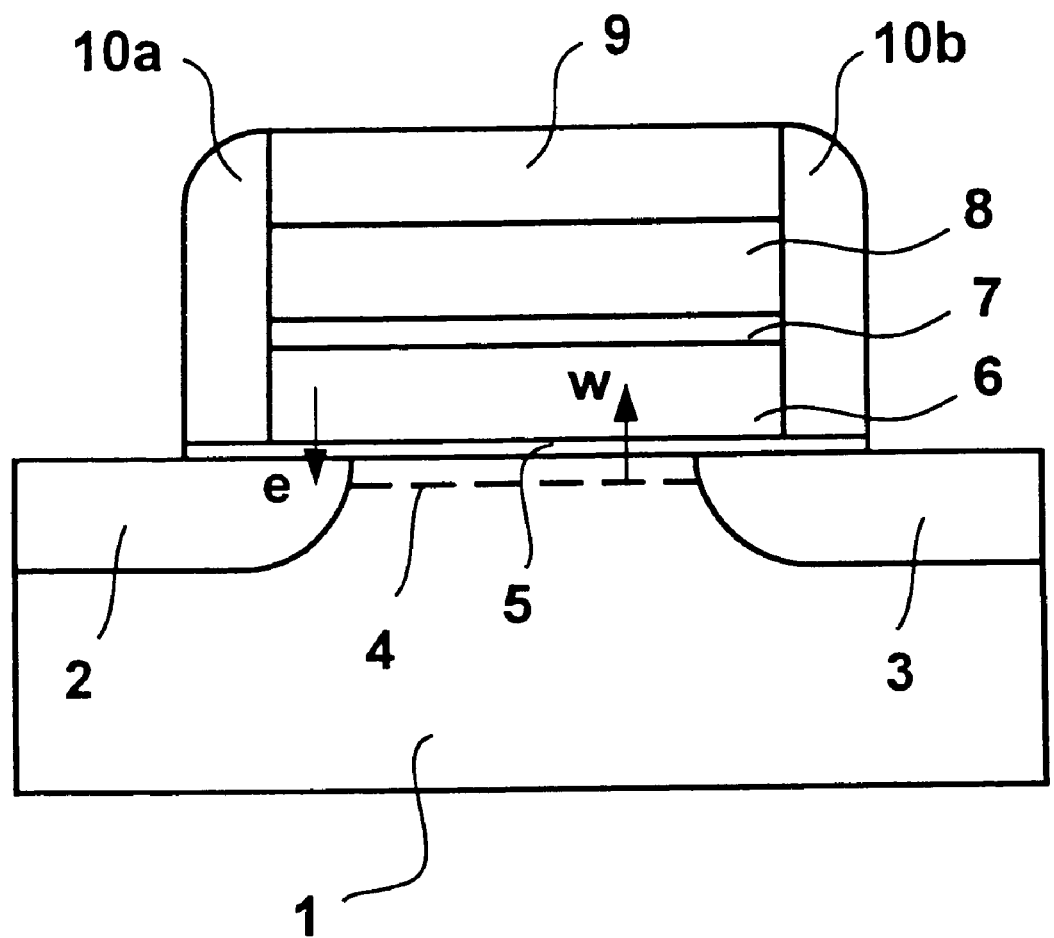
FIG. 1 is a cross-sectional view of a prior art device.

Referring to FIG. 1, a prior art flash memory cell is shown in cross-section. The memory cell is formed on a p-type silicon (Si) substrate 1. Laterally disposed at the surface of the substrate are source and drain regions 2, 3, which are used to contact a channel 4. A stacked gate structure serves to control conduction in the channel 4. The stacked gate structure comprises a tunnel barrier 5 which overlies the channel 4 and portions of the source and drain regions 2, 3, and a floating gate 6 is arranged thereon to act as a charge storage node. The stacked gate structure further comprises a control gate dielectric 7, which is formed on the floating gate 6 so as to separate it from a control gate 8, a capping oxide 9 and a pair of oxide spacer sidewalls 10a, 10b.

The tunnel barrier 5 comprises silicon dioxide ($SiO_2$) and has of thickness 10 nm. The floating gate 6 comprises 30 nm of n-type polycrystalline silicon (poly-Si). The control gate dielectric 7 comprises $Si_2$ and has a thickness of 20 nm. The control gate 8 comprises 60 nm of n-type poly-Si. The thickness of the: capping oxide 9 is 40 nm and each of the oxide spacers 10a, 10b has a lateral thickness of 40 nm.

The cell is programmed and erased by electrons tunnelling on and off the floating gate through the tunnel oxide along writing (w) and erasing (e) paths.

Device Operation

Programming and erasing of the prior art flash memory cell will now be described.

The cell is programmed with binary data '1' by applying a voltage $V_G$=12V to the control gate 8, a voltage $V_D$=6V to the drain 3 and grounding the source 2. Electrons tunnel through the tunnel oxide 5 from the channel 4 by a combination of channel hot-electron injection (CHEI) and drain-avalanche hot-carrier injection (DAHCI). Electron injection is relatively easy because the channel 4 is highly inverted and because electrons are "heated" by the high electric field in the channel 4 so as to have energies well above the conduction band edge.

A hot electron is an electron that is not in thermal equilibrium with the lattice and has an energy several times $k_bT$ above the Fermi energy, where $k_b$ is Boltzmann constant and T is lattice temperature in degrees Kelvin.

Once programmed, the control and drain biases are removed. Electrons are tightly retained on the floating gate 6 because the tunnel barrier 5 is ant effective insulator and also because the channel 4 is depleted. However, the source and drain regions 2, 3 are not depleted. Charge leakage from the floating gate 6 to the source and drain regions 2, 3 is prevented by having a sufficiently thick runnel barrier 5.

Information is erased by applying a voltage $V_S=12V$ to the source 2, grounding the control gate 8 and allowing the drain 4 to float. Electrons propagate from the floating gate 6 to the source region 2 by Fowler-Nordheim tunnelling, The time, $t_{program/erase}$, required to charge or discharge the floating gate 6 is inversely proportional to the floating gate/source (drain) current 1, where $Q_{FG}$ is the charge on the floating gate 6.

$$t_{program/erase} = \frac{Q_{FG}}{I_{program/erasse}}$$

Thus, erasing of the cell is slower because Fowler-Nordheim tunnelling currents are lower than hot-electron injection currents.

The operation speed of the cell would be improved if the erase time were reduced. The erase time can be reduced by increasing the erase current, $I_{erase}$. One method of achieving this is to use higher applied biases during the erase cycle. However, use of large biases is impractical because the tunnel barrier 5 will breakdown.

Another method is to use a thinner tunnel barrier 5. The magnitude of Fowler-Nordheim tunnelling currents is strongly dependent on the thickness of the tunnel barrier 5. Thus, using a thinner tunnel barrier would significantly reduce the erase time. However, a thinner tunnel barrier would also reduce the charge retention time fro the floating gate 6 and degrade the effectiveness of the memory.

The present invention seeks to solve both the speed and voltage problems.

DESCRIPTION OF PREFERRED EMBODIMENTS

First Embodiment

Device Layout

Figure 2:
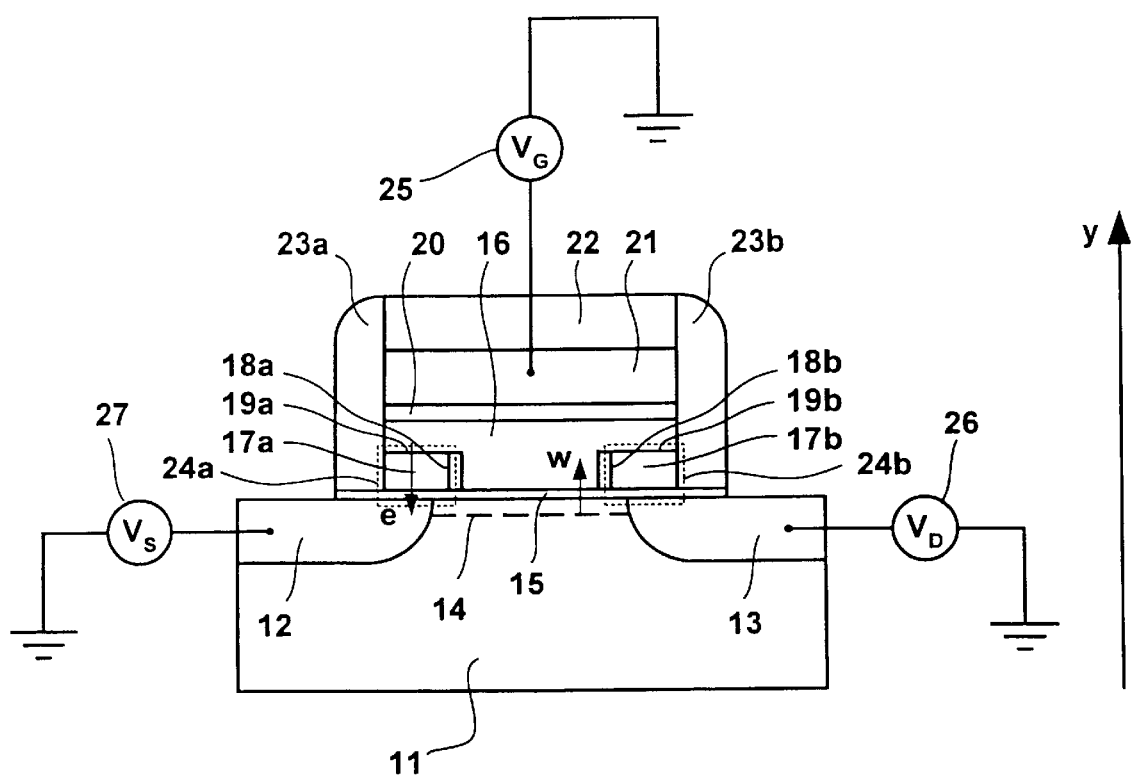
FIG. 2 is a cross-sectional view of a first embodiment of the present invention.

Referring to FIG. 2, a first embodiment of the present invention is a flash memory cell shown in cross-section, The memory cell is formed on a p-type Si substrate 11. Laterally disposed at the surface of the substrate are source and drain regions 12, 13, which are used to contact a channel 14. A stacked gate structure serves to control conduction in the channel 14 between the source and drain regions 12, 13. The stacked gate structure includes a tunnel barrier 15, which overlies the channel 14 and portions of the source and drain regions 12, 13.

The gate structure further includes a floating gate 16, which is 'T'-shaped in cross section and acts as a node to selectively store charge to produce a field which controls conduction in the channel 14 between source and drain regions 12, 13. The gate structure also includes first and second flanking intrinsic poly-Si regions 17a, 17b arranged on the tunnel barrier 15. First and second insulating oxides 18a, 18b are disposed between the stem of the 'T'-shaped gate 16 and the first and second intrinsic regions 17a, 17b respectively. First and second diffusion barriers 19a, 19b are disposed between the underside of the arms of the 'T'-shaped floating gate 16 and the first and second intrinsic regions 17a, 17b respectively, The stacked gate structure further comprises a control gate dielectric 20, which separates a control gate 21 from the top of floating gate 16. The stacked gate structure also comprises a capping oxide layer 22 and a pair of oxide spacer sidewalls 23a, 23b.

The tunnel barrier 15 comprises $SiO_2$ and has a thickness of 4 nm. The floating gate 16 comprises n-type poly-Si and has a thickness of 60 nm. The intrinsic poly-Si regions 17a, 17b have a thickness of 30 nm. Insulating, oxides 18a, 18b have a lateral thickness of 10 nm. Diffusion barriers 19a, 19b comprise $Si_3N_4$ and have a thickness of 1 nm. The diffusion barriers 19a, 19b present migration of impurity atoms from the n-type floating gate region 16 to the intrinsic poly-Si regions 17a, 17b. The control gate dielectric 20 comprises 20 nm of $SiO_2$. The control gate 21 comprises 60 nm of n-type poly-Si. The capping oxide 22 has a thickness of 40 nm and oxide spacers 23a, 23b have a lateral thickness of 40 nm.

The first diffusion barrier 19a, the first intrinsic layer 17a and the tunnel barrier 15 form a first silicon heterostructure hot-electron diode 4a over the source region 12. Similarly, the second diffusion barrier 19b, the second intrinsic layer 17b and the tunnel barrier 15 form a second silicon heterostructure hot-electron diode 24b over the drain region 13.

During an erase cycle, electron transport from the 'T'-shaped floating gate 16 to the source and drain regions 12, 13 is enhanced by hot-electron injection through the tunnel barrier 15 by means of the hot-electron diodes 24a, 24b.

At other times, electron transport from source and drain regions 12, 13 to the 'T'-shaped floating gate 16 and vice versa are suppressed because the intrinsic poly-Si regions 17a, 17b of the diodes 24a, 24b are depleted, thus forming additional barriers.

The characteristics of the silicon heterostructure hot-electron diodes 24a, 24b will now be described.

Figure 3:
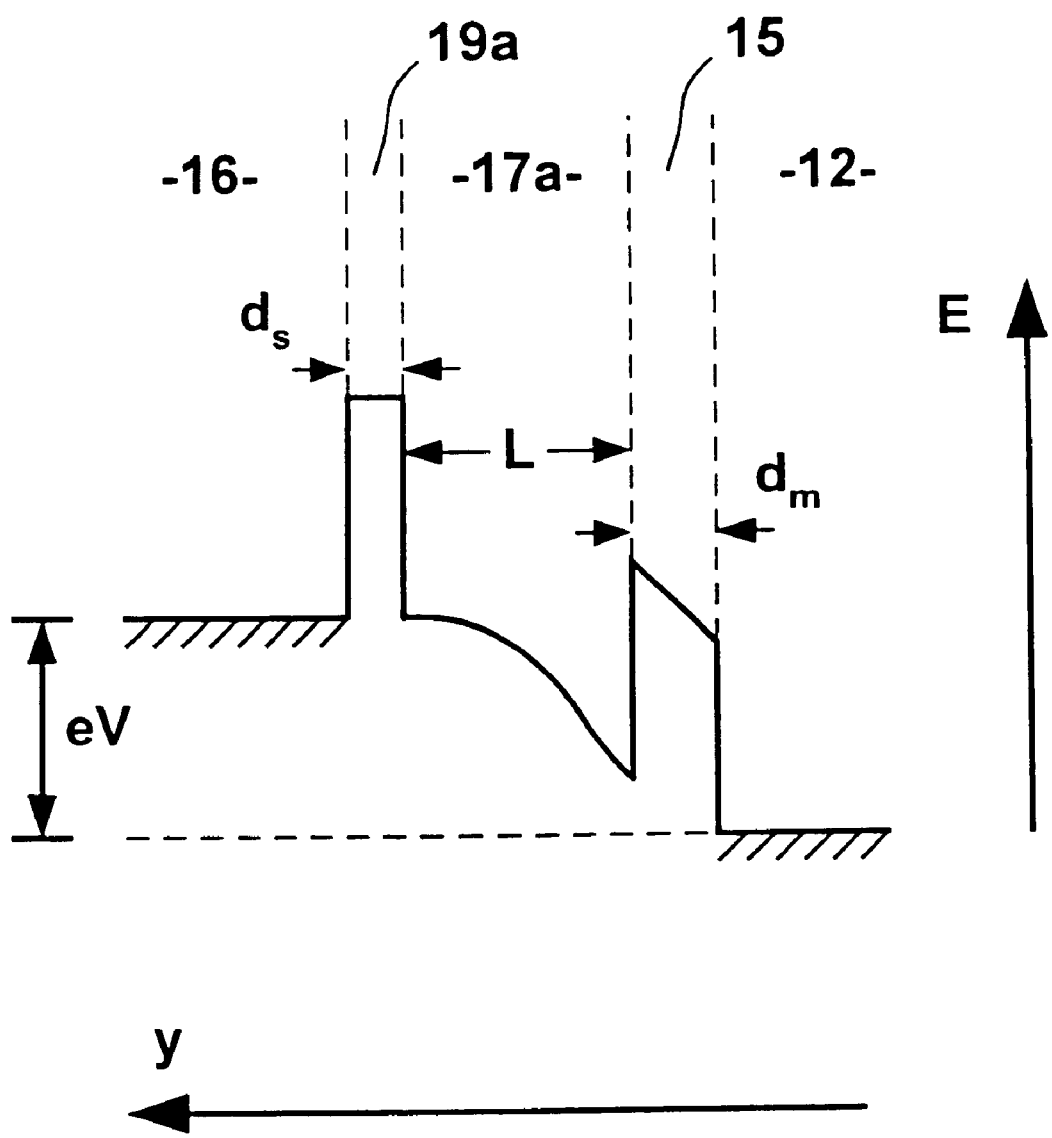
FIG. 3 is a conduction band-energy diagram of a silicon heterostructure hot-electron diode.

Referring to FIG. 3, a schematic conduction band edge profile of the silicon heterostructure hot-electron diode 24a is shown across which a voltage V is applied. In FIG. 3, the abscissa represents distance along the growth axis and the ordinate represents electron energy (E). The band edge profile comprises the diffusion barrier 19a of thickness $d_s=1$ nm, the intrinsic poly-Si layer 17a of thickness L=30 nm and the tunnel barrier 15 of thickness $d_m=4$ nm. The diffusion barrier 19a prevents migration of impurities from the n-type poly-Si floating gate 16 into the intrinsic poly-Si layer 17a. It will be appreciated by those skilled in the art that if diffusion can be suppressed, for example by low temperature growth, the diffusion barrier 19a is unnecessary Starring from zero applied bias, V=0 V, as bias across the hot-electron diode 24a is increased in magnitude, most of the applied bias falls across the intrinsic region 17a. The current is limited by the tunneling through the tunnel barrier 15 and electrons accumulate within the intrinsic region 17a at the interface of the intrinsic region 17a and the tunnel barrier 15. As the bias increases, the temperature of the electrons tunnelling through the tunnel barrier 15 gradually increases. This process continues until, at a threshold bias $V_T=6.2$ V, there is a rapid increase in current. At the threshold bias, the electron population within the intrinsic region 17a drops significantly, thus lowering the energy of the tunnel barrier 15 still further and there is an increase in electric current. This positive feedback mechanism switches the current from a low current state to a high current state, Furthermore, the temperature of electrons significantly increases. Electrons are injected across the tunnel barrier 15. The current is dominated by a thermionic current component, which is relatively insensitive to barrier thickness. Thus, above the threshold voltage $V_T$, the diode 24a produces a flow of hot electrons from the floating gate 16 through the tunnel barrier 15 to the source.

Device Operation

Programming and erasing of the flash memory cell shown in FIG. 2 will now be described.

The cell is programmed with binary data '1' by applying a voltage $V_G=6V$ to the control gate 21 using a gate voltage bias 25, a voltage $V_D=5V$ to the drain 13 using a drain voltage bias 26 and grounding the source 12 using the voltage bias 27. Electrons tunnel through the tunnel barrier 15 and onto the floating gate 16 by a combination of channel hot-electron injection (CHEI) and drain-avalanche hot-carrier injection (DAHCI) from the channel 14. Electron injection is relatively easy because the channel 14 is highly inverted and because electrons are "heated" by the high electric field in the channel 14 so as to have energies well above the conduction band edge. Furthermore, the write time $t_{program}$ is shorter than 100 μs for the prior art device due to the thinner tunnel barrier 15. In this example, the write time is below 1 μs and may even be as low as 100 ns. It add be appreciated that write times below 100 ns may also be achieved.

Once programmed, the control and drain biases, 25, 6 are removed, Electrons are tightly retained on the floating gate 16 because the intrinsic regions 17a, 17b and channel 14 are depleted. Thus, electrons stored on the floating gate 16 have no easy path by which to leak to the source or drain regions 12, 13 even though a thinner tunnel barrier 15 is used as compared with the tunnel barrier 5 used in the prior an device of FIG. 1.

The cell is erased by applying a voltage $V_S=6V$ to the source 12 using the source voltage bias 27, grounding The control gate 21 and alloying the drain 13 to float. A bias in excess of the voltage threshold, $V_T$, appears across the first hot-electron diode 24a. The hot-electron diode 24a is switched into a high current state. Tunnelling across the tunnel barrier 15, from the floating gate 16 to the source 12 is predominantly thermionic and is much higher than that found in the prior art device. Thus, the erase time terse is much quicker than compared with the prior art device. In this example, the erase rime is below 1 μs and may even be as low as 100 ns. It will be appreciated that write times below 100 ns may also be achieved.

Device Fabrication

Referring to FIG. 4a to 4e, a method of fabricating the flash memory cell shown in FIG. 2 id now be described.

Figure 4A:
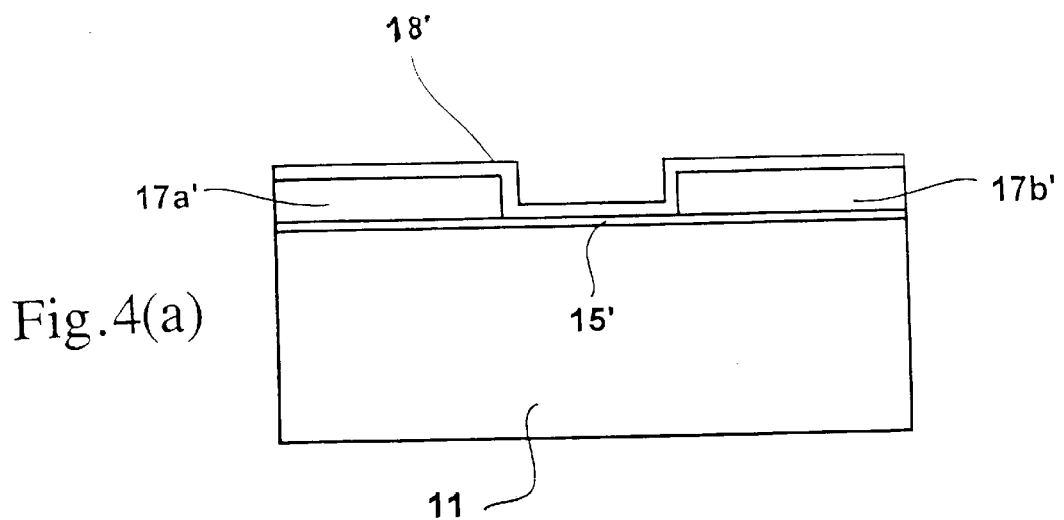
FIGS. 4a–4e show the fabrication sequence of a first embodiment of the present invention.

Using a p-type Si substrate 11, a $SiO_2$ tunnel barrier layer 15' that will form the tunnel barrier 15 is grown by dry oxidation at 850° C. The thickness of the $SiO_2$ tunnel barrier layer 15' is 4 nm, An intrinsic poly-Si layer (not shown) of thickness 30 nm and having background concentrations of $N_1=10^{16}$ cm$^{-3}$ is deposited by low pressure chemical vapour deposition (LPCVD) using silane ($SiH_4$) as a feed gas. The surface is patterned using conventional optical lithographic techniques and a $CF_4$ reactive ion etch (RIE) is used to remove a portion of the intrinsic poly-Si layer to leave first and second intrinsic poly-Si layers 17a', 17b'. A first insulating $SiO_2$ layer 18' is deposited by plasma enhanced chemical vapour deposition (PECVD) using SiH, and nitrous oxide ($N_2O$) as feed gasses. The thickness of the first insulating $SiO_2$ layer 18' is 10 nm. The corresponding structure is shown in FIG. 4a.

The first insulating $SiO_2$ layer 18' is anisotropically dry etched using $CEF_3$/ArRIE, to leave sidewalls 18a, 18b remaining.

Figure 4B:
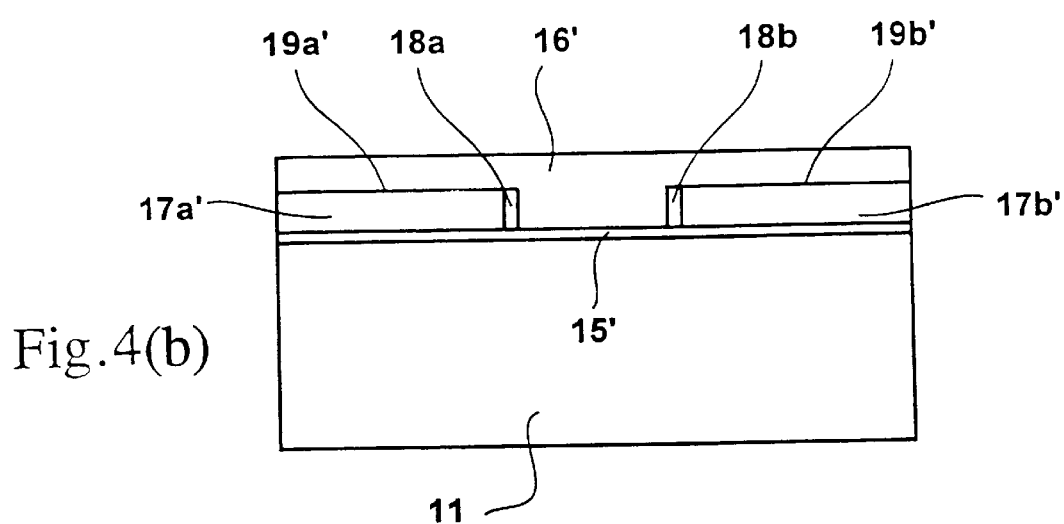

$Si_3N_4$ diffusion barriers 19a', 19b' are grown by thermal nitridation of the intrinsic poly-Si layers 17a', 17b' in an ammonia atmosphere. The thickness of the diffusion barriers 19a', 19b' is 1 nm. A first layer of n-doped poly-Si 16' is deposited by LPCVD using $SiH_4$ and phosphine ($PH_3$) as feed gases. The n-doped poly-Si layer 16' is 100 nm thick and is doped with P to a concentration of $N_P=10^{20}$ cm$^{-3}$. The n-doped poly-Si 16' is thinned to 30 nm by chemical mechanical polishing. The resulting configuration is shown in FIG. 4b.

A second insulating $SiO_2$ layer 20' is deposited by PECVD using $SiH_4$ and $N_2O$ as feed gases. The thickness of the second insulating $SiO_2$ layer 20' is 20 nm. A second n-type poly-Si layer 21' is deposited by LPCVD using $SiH_4$ and $PH_3$. The second n-type poly-Si layer 21' is 60 nm thick and is doped with P to a concentration of $N_P=10^{20}$ cm$^{-3}$. A third insulating $SiO_2$ layer 22' is deposited by PECVD using $SiH_4$ and $N_2O$ as feed gases. The thickness of the third insulating $SiO_2$ layer 22' is 40 nm. The corresponding structure is shown in FIG. 4c.

Figure 4C:
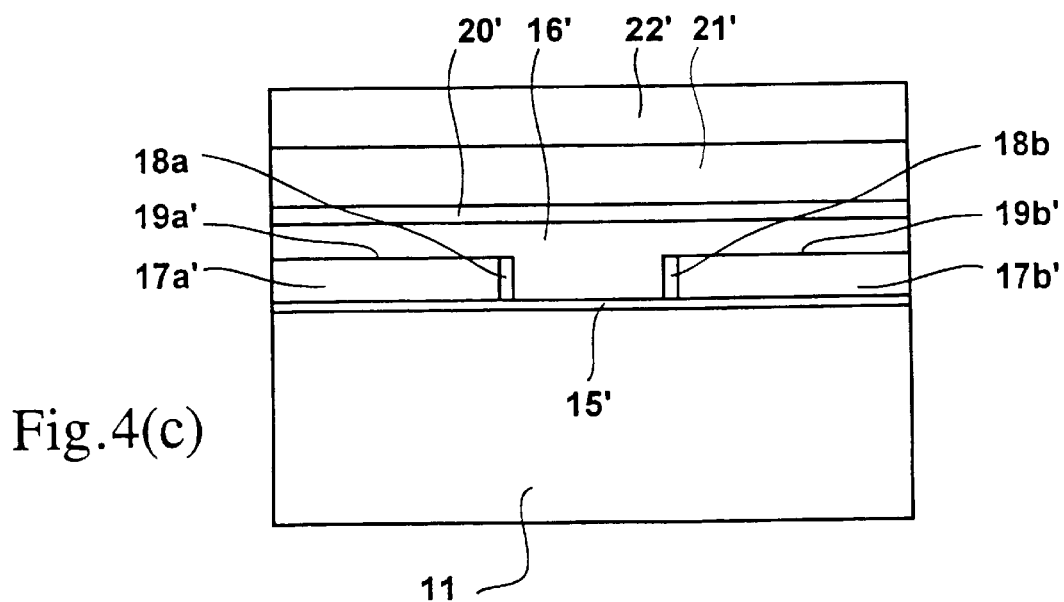
Figure 4D:
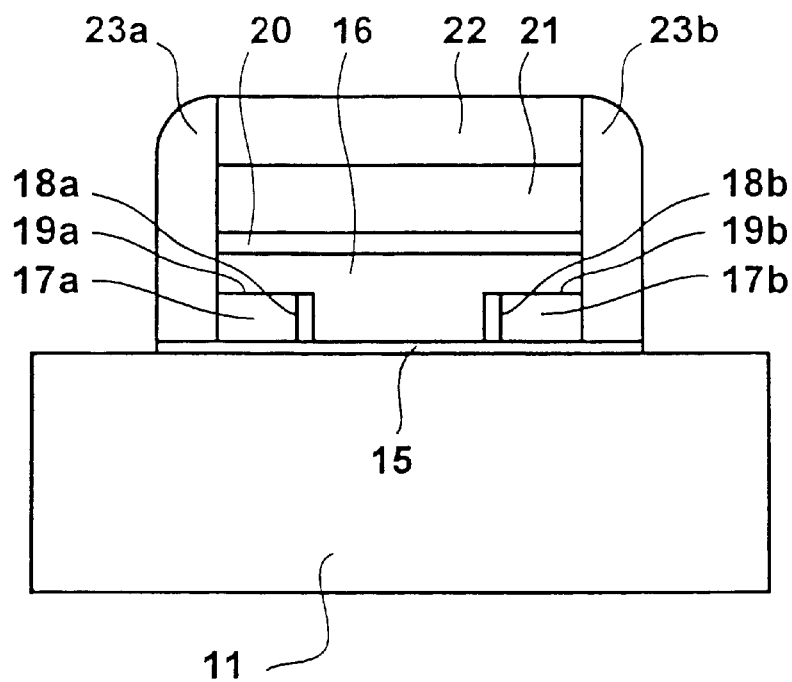

The structure shown in FIG. 4c is patterned using conventional optical lithography and is etched by a succession of $CF_4$ and $CHF_3$/Ar dry etches as far as the substrate 11. A fourth insulating $SiO_2$ layer (not shown) is deposited by PECVD using $SiH_4$ and $PH_3$. The thickness of the fourth insulating $SiO_2$ layer is 40 nm. The fourth insulating $SiO_2$ layer is anisotropically dry etched using $CHF_3$/Ar RIE, to leave $SiO_2$ spacer layers 23a, 23b as shown in FIG. 4d.

Figure 4E:
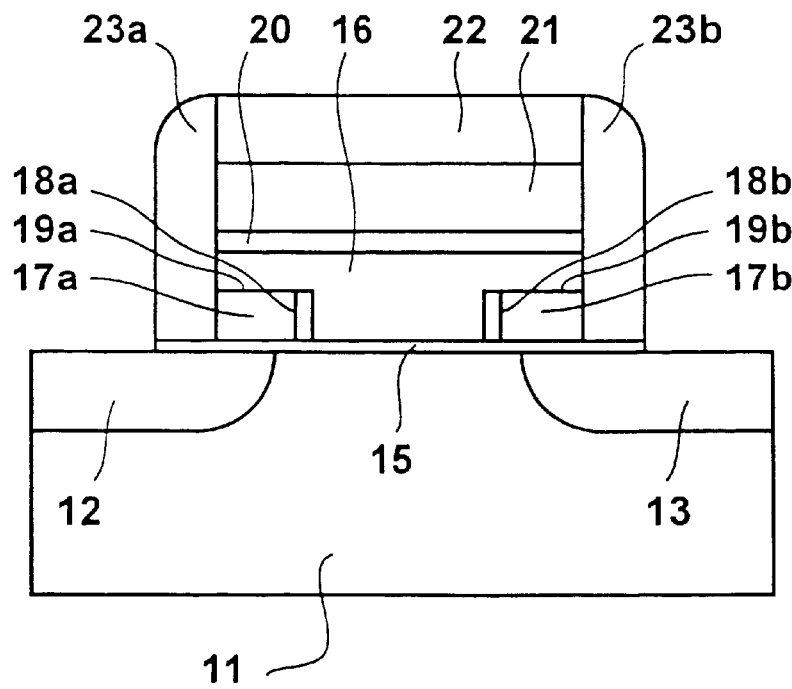

An ion implantation using arsenic ions is used to form source 12 and drain 13 regions as shown in FIG. 4e. The implantation is activated by a thermal anneal, Second Embodiment Device Layout Referring to FIG. 5, a second embodiment of the present invention is shown in cross-section. The memory cell is formed on a p-type Si substrate 28. Laterally disposed at the surface of the substrate 28 are source 29 and drain 30 regions, which are used to contact a channel 31. A gale structure is disposed over the channel 31 and portions of the source and drain regions 29, 30. The gate structure comprises a tunnel barrier 32 on which are disposed a floating gate 33, which acts as a node to selectively store charge to produce a field which controls conduction in the channel 31, and first and second flanking poly-Si intrinsic regions 34a, 34b, separated from the floating gate 33 by diffusion barriers 35a, 35b A control gate dielectric 36 overlies the floating gate 33 to separate the floating gate 33 from a control gate 37. A capping oxide 38 lies over the control gate 37. A conformal oxide 39 covers the gate structure.

The tunnel barrier 32 comprises $SiO_2$ of thickness 4 nm, which separates the channel 31 from the floating gate 33. The floating gate 33 is 60 nm thick and comprises n-type poly-Si. Diffusion barriers 35a, 35b comprise $Si_3N_4$ and are disposed on sidewalls of the floating gate 33 so as to separate the floating gate 33 from intrinsic poly-Si regions 34a, 34b on either side. The diffusion barriers 35a, 35b prevent segregation of impurities from the doped floating gate 33 to the intrinsic poly-Si regions 34a, 34b. The control gate dielectric 36 comprises 20 nm of $SiO_2$ and separates the floating gate 33 from the control gate 37 comprising 60 nm of n-type poly-Si. The thickness of the capping oxide 38 and the conformal oxide 39 is 40 nm.

The first diffusion barrier 35a, the first intrinsic layer 34a and the tunnel barrier 32 form a first silicon heterostructure hot-electron diode 40a over the source region 29. Similarly, the second diffusion barrier 35b, the second intrinsic layer 34b and the tunnel barrier 32 form a second silicon heterostructure hot-electron diode 40b over the drain region 30.

Device Operation

Figure 5:
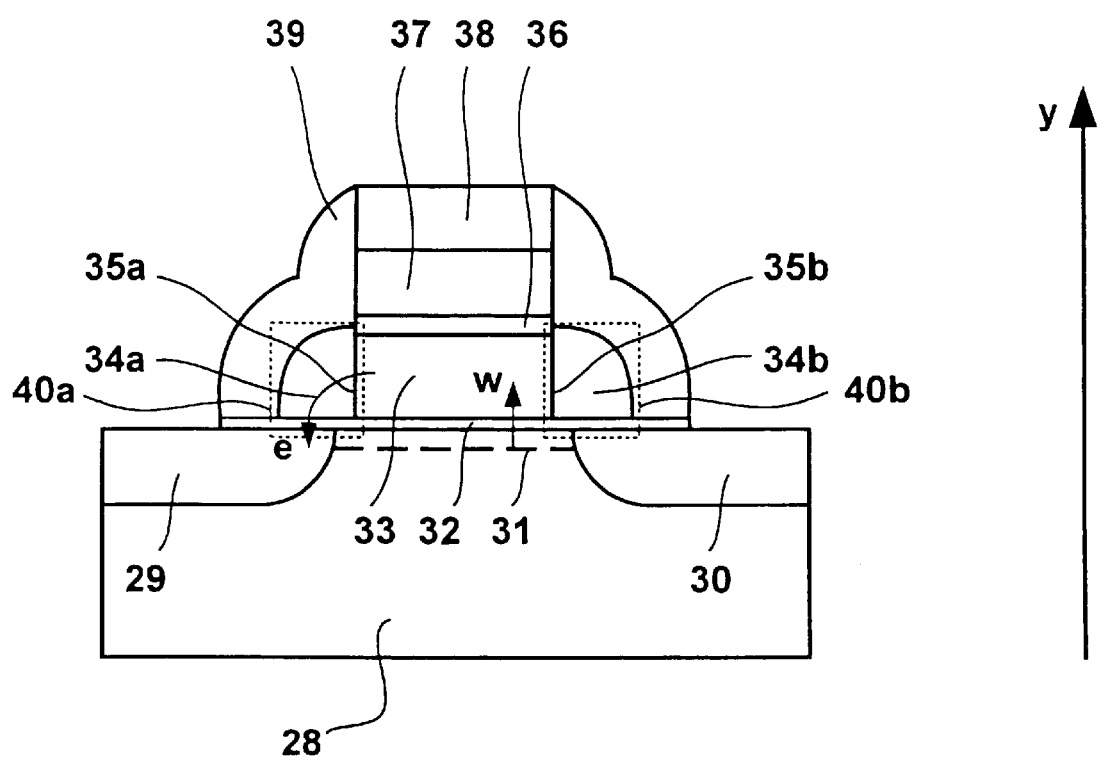
FIG. 5 is a cross-sectional view of a second embodiment of the present invention.

Programming and erasing of the flash memory cell shown in FIG. 5 is the same as that described earlier with respect to the flash memory cell shown in FIG. 2.

Device Fabrication

Figure 6A:
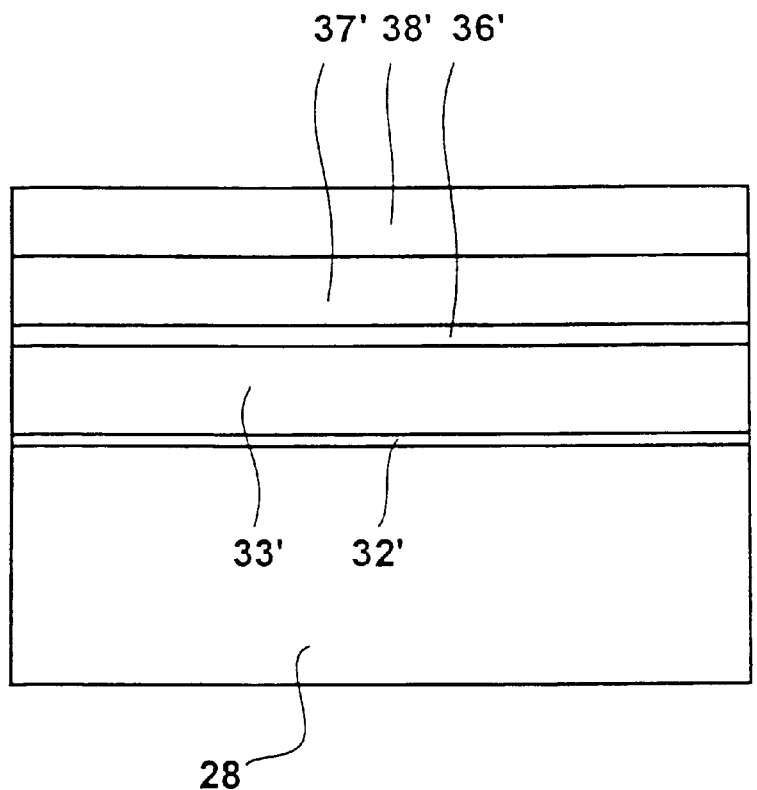
FIGS. 6a–6d show the fabrication sequence of a second embodiment of the present invention.
Figure 6B:
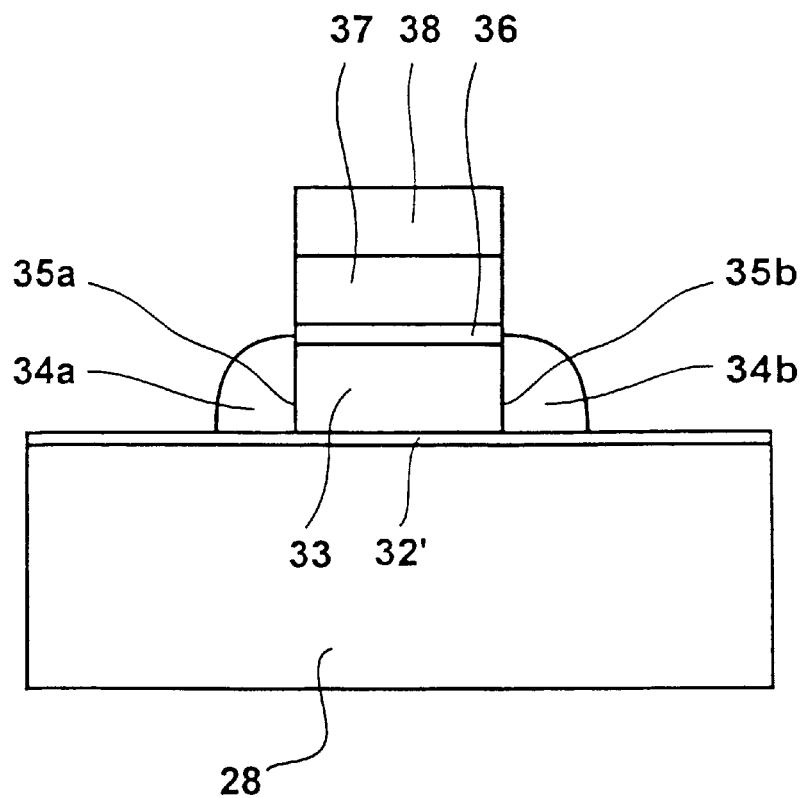
Figure 6C:
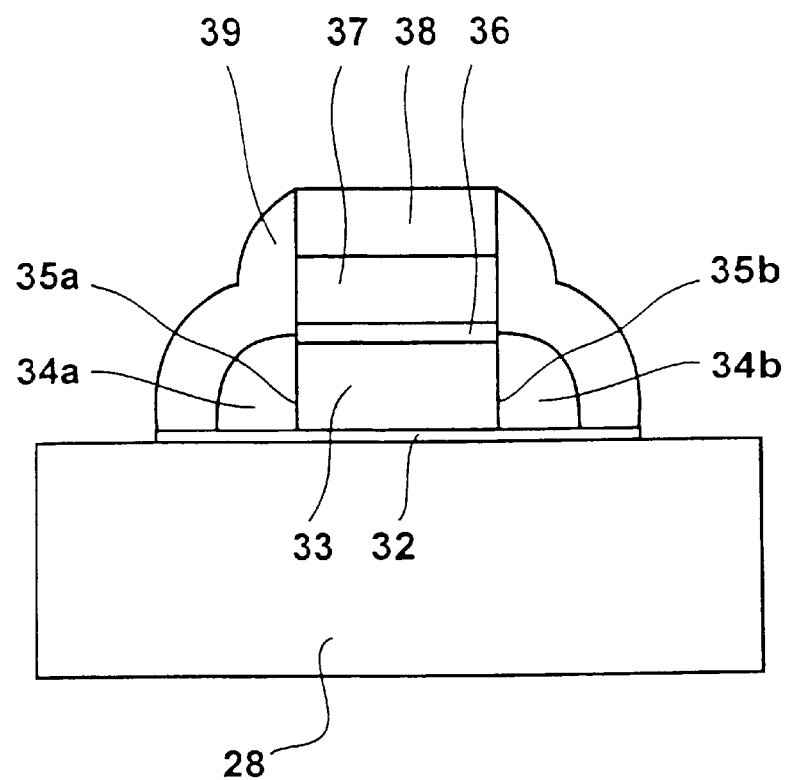

Referring to FIGS. 6a to 6c, a method of fabricating flesh memory cell shown in FIG. 5 will now be described.

Using a p-type Si substrate 28, a $SiO_2$ tunnel barrier layer 32' is grown by dry oxidation at 850° C. The thickness of the $SiO_2$ tunnel barrier layer 32' is 4 nm. A first n-type poly-Si layer 33' is deposited by LPCVD using $SiH_4$ and $PH_3$. The first n-type poly-Si layer 33' is 30 nm thick and is doped with P to a concentration of $N_P=10^{20}$ cm$^{-3}$.

A first insulating $SiO_2$ layer 36' is deposited by PECVD using $SiH_4$ and $N_2O$. The thickness of the first insulating $SiO_2$ layer 36' is 20 nm. A second n-type poly-Si layer 37' is deposited by LPCVD using SiH, and $PH_3$. The second poly-Si layer 37' is 60 nm thick and is doped with P to a concentration of $N_P=10^{20}$ cm$^{-3}$. A second insulating $SiO_2$ layer 38' is deposited by PECVD using $SiH_4$ and $N_2O$. The thickness of the second insulating $SiO_2$ layer 38' is 40 nm. The resulting configuration is shown in FIG. 6a.

The structure shown in FIG. 6a is patterned using conventional optical lithography and is etched by a succession of $CF_4$ and $CHF_3$/Ar dry etches as far as the tunnel barrier 32'.

$Si_3N_4$ diffusion barriers 35a, 35b is grown by thermal nitridation of the sidewalls of floating gate 33 in an ammonia atmosphere. An intrinsic poly-Si layer (not shown) is deposited by LPCVD using $SiH_4$. The intrinsic poly-Si layer is 30 nm thick and has a background impurity concentration of $N_1=10^{16}$ cm$^{-3}$. Anisotropic $CF_4$ RIE is used to remove the intrinsic poly-Si layer leaving sidewall portions 34a, 34b as shown in FIG. 6b.

A conformal $SiO_2$ layer 39 is formed by dry oxidation at 850° C. The conformal oxide 39 is 40 nm thick. The structure is etched to remove the conformal oxide 39 and tunnel barrier 32' to produce the configuration as shown in FIG. 6c.

Figure 6D:
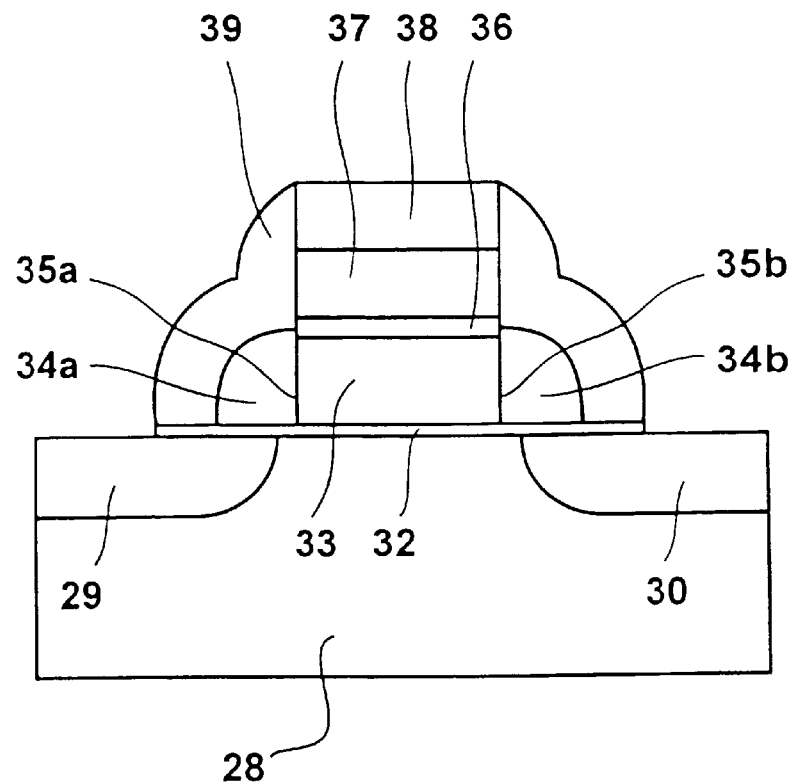

An ion implantation using arsenic ions is used to form source 29 and drain 30 regions as shown in FIG. 6d. The implantation is activated by a thermal anneal.

It will be appreciated that other materials may be used as a tunnel barrier and that the hot-electron diodes may be configured in different arrangements. A procedure by which tunnel barriers material and thickness are chosen will now be described.

Figure 7:
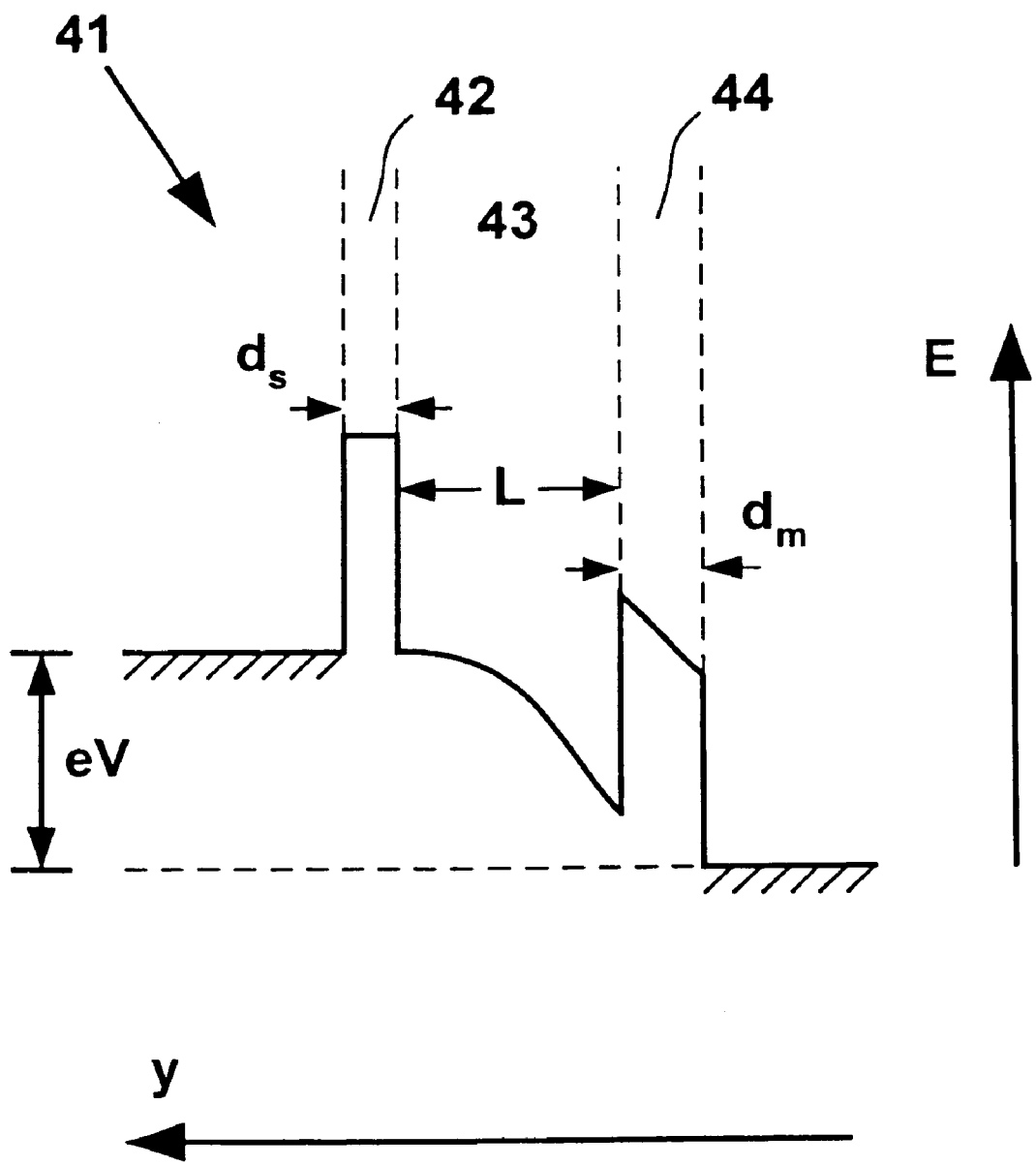
FIG. 7 is a conduction band-energy diagram of a generalised silicon heterostructure hot-electron diode.

Referring to FIG. 7, a schematic conduction band edge profile of a generalised silicon heterostructure hot-electron diode 41 is shown across which a voltage V is applied. The band edge profile comprises a source barrier 42 of thickness $d_s$, a transit layer 43 of thickness L and a main barrier 44 of thickness $d_m$. These layers correspond to the diffusion barrier 19a, intrinsic region 17a and tunnel barrier 15 respectively as shown in FIG. 3. It will be appreciated that the source barrier 42 need not be included.

Figure 8A:
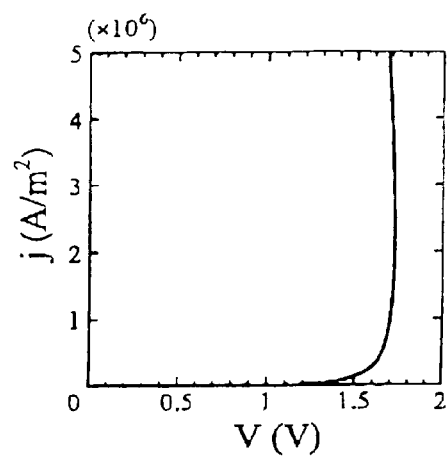
FIG. 8a is a graph of electric current density against applied bias for a silicon heterostructure hot-electron diode.
Figure 8B:
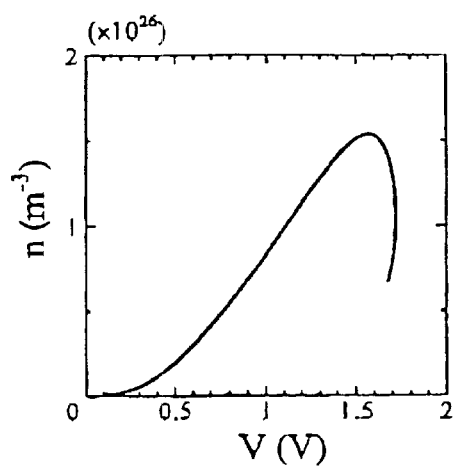
FIG. 8b is a graph of electron density against applied bias for a silicon heterostructure hot-electron diode.
Figure 8C:
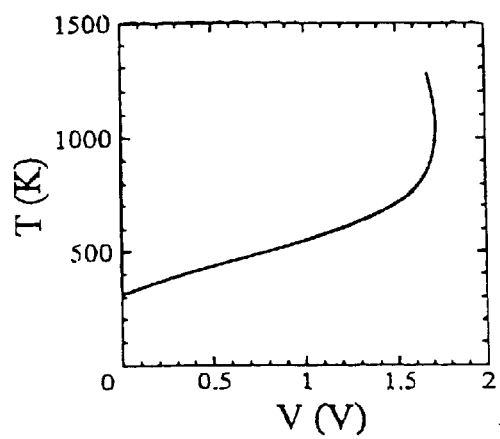
FIG. 8c is a graph of electron temperature against applied bias for a silicon heterostructure hot-electron diode.

Referring to FIG. 8, the dependencies of the electric current density j (FIG. 8a), the electron density n (FIG. 8b) and the electron temperature T at the interface between the transit region 43 and the main barrier 44 (FIG. 8c), on the applied bias are shown. In this example, the source barrier 42 comprises $Si_3N_4$ of thickness 1 nm, the transit layer 43 comprises intrinsic poly-Si, having a background doping concentration of $10^{15}$ cm$^{-3}$ and a thickness of 100 nm and the main barrier 44 comprises $Si_3N_4$ of thickness 3.5 nm. A sudden increase of electric current occurs at an applied voltage of around 1.7 V. When the electric current increases, the electron temperature increases and the number of accumulated, electrons in the transit layer 43 decreases This results in a further increase of electric current. This positive feedback mechanism switches the current from a low current state to high current state.

Figure 9A:
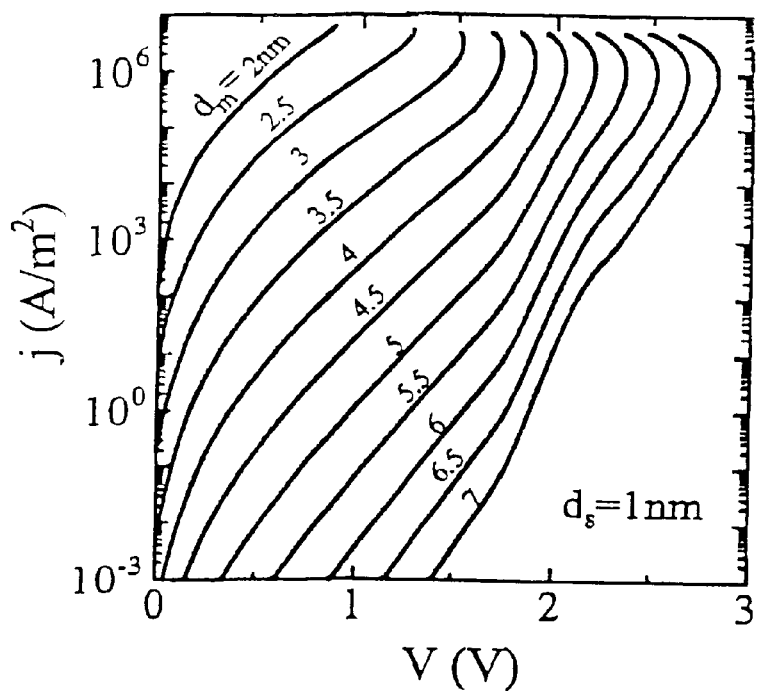
FIG. 9a is a graph of electric current density against applied bias for different main barrier thicknesses for a silicon heterostructure hot-electron diode.
Figure 9B:
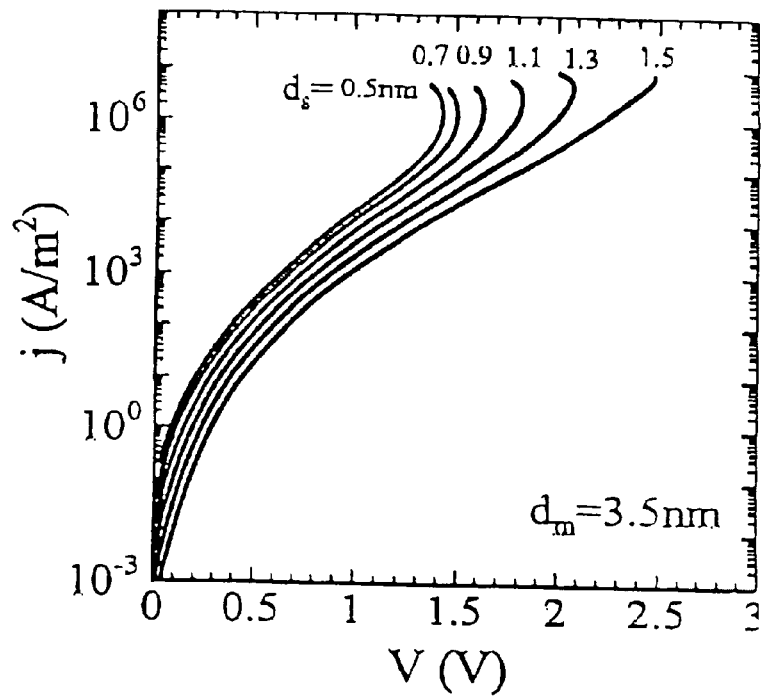
FIG. 9b is a graph of electric current density against applied bias for different source barrier thicknesses for a silicon heterostructure hot-electron diode and FIG. 10 is a graph of the transition voltage against current density for different barrier types and thicknesses for a silicon heterostructure hot-electron diode.

Referring to FIG. 9, the dependence of electric current on barrier thickness is shown. At low applied voltage, the electric current is determined by pure tunnelling and so is strongly dependent on the thickness of the main barrier 44. However, after the transition, the current is only weakly dependent on the thickness of the main barrier 44, since the thermionic current component becomes dominant due to the high electron temperature.

Figure 10:
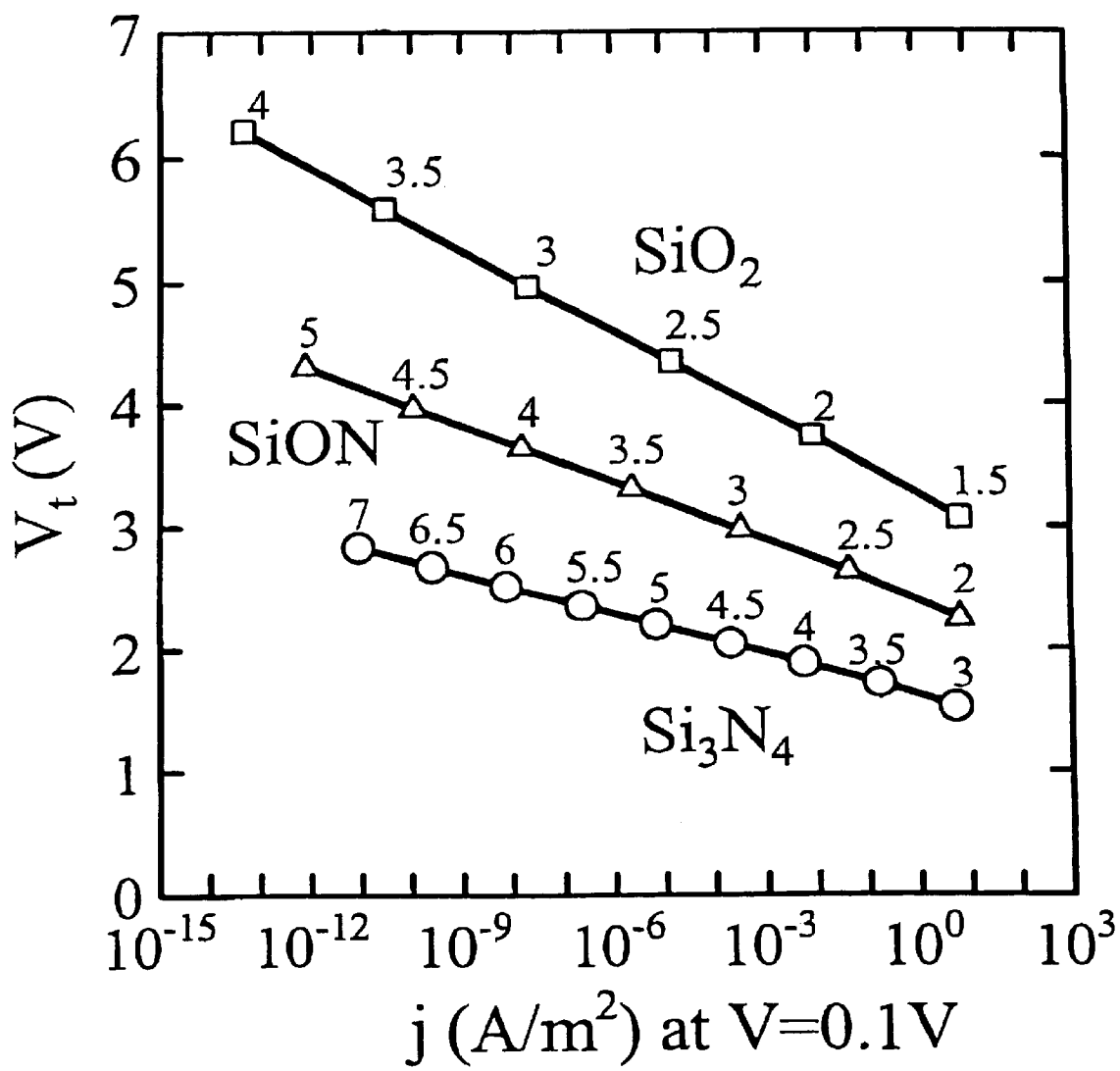

Referring to FIG. 10, the transition voltage $V_t$, where the current enters into a negative differential resistance region is plotted against current density. As shown, $Si_3N_4$ is most suitable for low voltage operation around 3V The operation voltage is around 6V in the case of a main barrier comprising $SiO_2$.

In the first embodiment of the present invention, the stacked gate structure size is 0.2×0.2 $\mu m^2$ (40×10$^{-15}$ m$^2$). The charge stored on the floating gate 16 is 0.3 fC. To have a 10-year retention time, the current density at low applied voltage must be less than 10$^{-11}$ Am$^{-2}$ and this condition is satisfied if the tunnel barrier 15 is made from 7 nm of $Si_3N_4$, 5 nm of SiON or 4 nm of $SiO_2$. The ON current is around 10$^{-6}$ Am$^{-2}$, which gives an erase time of around 100 ns.

In an alternative embodiment of the present invention, the memory cell has a stacked gate structure with a area of 0.1×0.1 $\mu m^2$ (10×10$^{-15}$ m$^2$), a 7 nm thick $SiN_4$ tunnel barrier 15 and a pair of hot-electron diodes 24a, 24b each with an area of 0.1×0.03 $\mu m^2$ (3×10$^{-15}$ m$^2$).

During programming, an estimated write current of approximately 5 nA injects 0.5fC of charge onto the node 16. Thus, the node 16, once programmed, floats at 5V. Under these circumstances the write time is around 100 ns.

During erasing, the erase current is 15 nA (correspond kg to a current density of 5×10$^6$ Am$^{-2}$) and so the erase time is 33 ns.

Therefore, it will be appreciated that instead of a $SiO_2$ tunnel barrier 15, a SiON or a $Si_3N_4$ tunnel barrier may used and thickness of these barriers are 5 and 7 nm respectively. Such barrier may be deposited using plasma enhanced chemical vapour deposition (PECVD) or low pressure chemical vapour deposition (LPCVD)

It will be appreciated that many modifications may be made to the embodiments described above. For instance, it will be appreciated that the hot-electron diodes and the floating gate need not share the same tunnel barrier. Furthermore, the hot-electron diodes need not have a diffusion barrier, Silicon nitride having non-stoichiometric mixture may be used. Instead of using intrinsic silicon, low-doped silicon may be used. The amorphous or crystalline silicon may be used instead of polycrystalline where appropriate. Other dielectrics may be used such as oxide/nitride/oxide (ONO), $Ta_2O_5$ or $TiO_2$ layers. Furthermore, other methods of CVD and other feed gasses may be used. Information may be represented by holes, instead of electrons. Methods other than chemical mechanical polishing may be used to thin layers.

What is claimed is:

1. A memory device comprising:

a path for charge carriers;

source and drain regions disposed at either end of the path;

a node for storing charge carriers to produce a field which alters the conductivity of the path and first and second hot-carrier diodes each for converting stored charge carriers into hot charge carriers so as to allow said charge carriers to leave said node and enter said source or drain regions in response to a given voltage configuration and for preventing charge carriers entering said source and drain regions in the absence of said voltage configuration.

2. The device according to claim 1 further comprising a control electrode operable to control charging and discharging of the node.

3. A method of operating a memory device according to claim 2 comprising applying a gate bias to the control electrode, a drain bias to the dram region and a source bias to the source region.

4. A method according to claim 3 wherein the applying of thee gate bias comprises setting the gate bias to 0V and setting either the drain bias or the source bias to 6V.

5. The device according to claim 1, wherein the carrier comprises electrons.

6. The device according to claim 1, wherein the first converter comprises semiconductor material.

7. The device according to claim 6, wherein the semiconductor material is silicon.

8. The device according to claim 6, wherein the semiconductor material is undoped.

9. The device according to claim 6, wherein the semiconductor is doped with an impurity.

10. The device according to claim 9, wherein the impurity concentration is less than $10^{17}$ cm$^{-3}$.

11. The device according to claim 9, wherein the impurity comprises an element that donates electrons.

12. The device according to claim 11, wherein the impurity is phosphorous.

13. The device according to claim 11, wherein the impurity is arsenic.

14. The device according to claim 9, wherein the impurity comprises an element that accepts electrons.

15. The device according to claim 14, wherein the impurity is boron.

16. The device according to claim 1 further comprising a first tunnel barrier through which charge carriers may tunnel to reach the node.

17. The device according to claim 16, wherein the first hot-carrier diode comprises a second tunnel barrier.

18. The device according to claim 17, wherein the first and second tunnel barriers are unitary.

19. The device according to claim 17, wherein the second hot-carrier diode comprises a third tunnel barrier.

20. The device according to claim 19, wherein the first barrier, second and third tunnel barriers are unitary.

21. The device according to claim 18, wherein the unitary barrier has a uniform thickness.

22. The device according to claim 21, wherein the unitary tunnel barrier comprises silicon dioxide.

23. The device according to claim 21, wherein the unitary tunnel barrier comprises silicon nitride.

24. The device according to claim 21, wherein the unitary tunnel barrier comprises silicon oxynitride.

25. The device according to claim 21, wherein the thickness of the unitary tunnel barrier is between 2 and 10 nm.

26. The device according to claim 19, wherein said charge carriers leave the node via the second or third tunnel barrier.

27. The device according to claim 19, wherein said charge carriers enter the node via the first tunnel barrier.

28. The device according to claim 16, wherein the first tunnel barrier is disposed between said node and said path.

29. The device according to claim 1, wherein charge carriers pass onto said node in response to a different voltage configuration.

30. The device according to claim 27 further comprising a first tunnel barrier through which charge carriers may tunnel to reach the node.

31. The device according to claim 30, wherein said charge carriers pass though the first tunnel barrier from said path.

32. The device according to claim 1, wherein the first hot-carrier diode comprises a diffusion barrier.

33. The device according to claim 32, wherein the diffusion barrier comprises silicon nitride.

34. The device according to claim 32, wherein the thickness of the diffusion barrier is between 0.5 and 3 nm.

35. The device according to claim 1, wherein the hot-carrier diodes and the node are unitary.

36. A memory device comprising:

a path for charge carriers;

a node for storing charge carriers to produce a field which alters the conductivity of the path and first and second hot-carrier diodes for converting stored charge carriers into hot; charge carriers so as to allow said charge carriers to leave said node and enter said source or drain regions in response to a given voltage configuration and configured to prevent charge carriers from leaving said node in the absence of said voltage configuration.

37. A memory device comprising:

a channel for charge carriers;

a node for storing charge carriers to produce a field which alters the conductivity of the channel, a tunnel barrier disposed between said node and said path, for preventing charge carriers from entering or leaving said node, the improvement comprising a hot-carrier diode for additionally preventing charge from tunnelling from said channel to said node and said tunnel barrier being sufficiently thin to allow said node to be both charged and discharged on a sub-microsecond timescale.

38. The device according to claim 36, wherein said tunnel barrier is sufficiently thin to allow said node to be both charged and discharged in approximately 100 ns.

39. A memory device comprising:

a channel for charge carriers;

a node for storing charge carriers to produce a field which alters the conductivity of the channel, a tunnel barrier disposed between said node and said path for preventing charge carriers from entering or leaving said node, the improvement comprising a hot-carrier diode for additionally preventing charge from tunnelling from said channel to said node and said tunnel barrier having a thickness between 2 to 10 nm.

40. The device according to claim 38, wherein said tunnel barrier is approximately 4 nm thick.

41. The device according to claim 39, wherein said tunnel barrier comprises silicon dioxide.

42. A memory device comprising:

a path for charge carriers;

source and drain regions disposed at either end of the path;

a node for storing charge carriers to produce a field which alters the conductivity of the path; and first and second hot-carrier diodes each for converting stored charge carriers into hot charge carriers inside said node so as to allow said charge carriers to leave said node and enter said source or drain regions in response to a given voltage configuration and for preventing charge carriers entering said source and drain regions in the absence of said voltage configuration.

* * * * *